United States Patent
Fu et al.

(10) Patent No.: US 7,756,384 B2
(45) Date of Patent: Jul. 13, 2010

(54) METHOD FOR FORMING ANTI-REFLECTIVE COATING

(75) Inventors: Peng-Fei Fu, Midland, MI (US); Eric Scott Moyer, Midland, MI (US); Craig Rollin Yeakle, Midland, MI (US)

(73) Assignee: Dow Corning Corporation, Midland, MI (US)

( * ) Notice: Subject to any disclaimer, the term of this patent is extended or adjusted under 35 U.S.C. 154(b) by 54 days.

(21) Appl. No.: 11/666,813

(22) PCT Filed: Sep. 29, 2005

(86) PCT No.: PCT/US2005/035235

§ 371 (c)(1),
(2), (4) Date: Mar. 11, 2008

(87) PCT Pub. No.: WO2005/081865

PCT Pub. Date: Sep. 9, 2005

(65) Prior Publication Data

US 2008/0273561 A1    Nov. 6, 2008

Related U.S. Application Data

(60) Provisional application No. 60/636,957, filed on Dec. 17, 2004.

(51) Int. Cl.
*G02B 6/00* (2006.01)
(52) U.S. Cl. ............................ 385/141; 257/E21.262
(58) Field of Classification Search ................ 385/88, 385/92, 141; 372/34–36; 257/E21.262
See application file for complete search history.

(56) References Cited

U.S. PATENT DOCUMENTS

| 4,756,977 A | * | 7/1988 | Haluska et al. | ............. 428/704 |
| 5,010,159 A | | 4/1991 | Bank et al. | |

(Continued)

FOREIGN PATENT DOCUMENTS

WO    WO 2006/065310    6/2006

(Continued)

OTHER PUBLICATIONS

Schiavone et al., SiON based antireflective coating for 193nm lithography, Part of the SPIE Conference on Advances in Resist Technology and Processing XVI, SPIE vol. 3678, Mar. 1999, 391-395.

(Continued)

*Primary Examiner*—Rhonda S Peace
(74) *Attorney, Agent, or Firm*—Sharon K. Brady

(57) ABSTRACT

A method of forming an antireflective coating on an electronic device comprising (A) applying to an electronic device an ARC composition comprising (i) a silsesquioxane resin having the formula $(PhSiO_{(3-x)/2}(OH)_x)_m\ HSiO_{(3-x)/2}(OH)_x)_n$, where Ph is a phenyl group, x has a value of 0, 1 or 2; m has a value of 0.05 to 0.95, n has a value of 0.05 to 0.95 and $m+n\approx1$; and (ii) a solvent; and (B) removing the solvent and curing the silsesquioxane resin to form an antireflective coating on the electronic device.

16 Claims, 1 Drawing Sheet

Dependence of Ph% on k@193nm of T(Ph)T(H) Resin

U.S. PATENT DOCUMENTS

| | | | |
|---|---|---|---|
| 5,762,697 | A | 6/1998 | Sakamoto et al. |
| 5,891,529 | A * | 4/1999 | Harkness et al. ............ 427/510 |
| 6,268,457 | B1 | 7/2001 | Kennedy et al. |
| 6,281,285 | B1 | 8/2001 | Becker et al. |
| 6,395,397 | B2 | 5/2002 | Hong et al. |
| 6,420,088 | B1 | 7/2002 | Angelopoulos et al. |
| 6,506,497 | B1 | 1/2003 | Kennedy et al. |
| 6,792,015 | B1 * | 9/2004 | Theodoras et al. ............ 372/34 |
| 6,852,928 | B2 * | 2/2005 | Giaretta et al. .............. 174/547 |
| 7,018,114 | B2 * | 3/2006 | Stewart ....................... 385/92 |
| 2002/0187422 | A1 * | 12/2002 | Angelopoulos et al. .. 430/270.1 |
| 2008/0014335 | A1 * | 1/2008 | Fu et al. ....................... 427/58 |
| 2008/0318436 | A1 * | 12/2008 | Fu et al. ..................... 438/758 |

FOREIGN PATENT DOCUMENTS

| | | |
|---|---|---|
| WO | WO 2006/065316 | 6/2006 |
| WO | WO 2006/065321 | 6/2006 |
| WO | WO 2006065321 A1 * | 6/2006 |

OTHER PUBLICATIONS

Kennedy et al., An Anthraacene-Organosiloxane Spin On Antireflective Coating for KrF Lithography, Advances in Resist Technology and Processing XX, Theodore H. Fedynshyn, Editor, Proceedings of SPIE vol. 5039, 2003, 144-151.

Kennedy et al., Organosiloxane based Bottom Antireflective Coatings for 193nm Lithography, Advances in Resist Technology and Processing XX, Theodore H. Fedynyshyn, Editor, Proceedings of SPIE vol. 5039, 2003, 929-939.

* cited by examiner

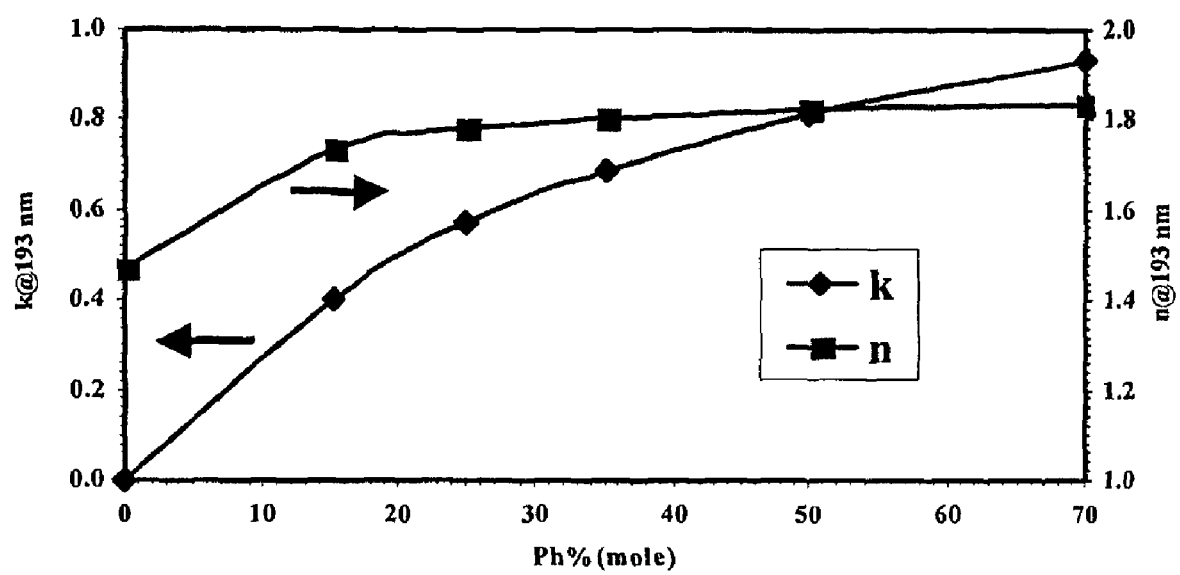

METHOD FOR FORMING ANTI-REFLECTIVE COATING

This application is a U.S. national stage filing under 35 U.S.C. §371 of PCT Application No. PCT/US2005/035235 filed on 29 Sep. 2005, currently pending, which claims the benefit of U.S. Provisional Patent Application No. 60/636,957 filed 17 Dec. 2004 under 35 U.S.C. §119 (e). PCT Application No. PCT/US2005/035235 and U.S. Provisional Patent Application No. 60/636,957 are hereby incorporated by reference.

With the continuing demand for smaller feature sizes in the semiconductor industry, 193 mm optical lithography has emerged very recently as the technology to produce devices with sub-100 nm. The use of such shorter wavelength of light requires the bottom antireflective coating (BARC) to reduce the reflection on the substrate and dampen the photoresist swing cure by absorbing light that has been passed through the photoresist. Commercially available antireflective coatings (ARC) consist of both organic and inorganic materials. Typically, the inorganic ARC, which exhibit good etch resistant, is CVD based and is subject to all of the integration disadvantage of extreme topography. The organic ARC materials are applied by spin-on process and have excellent fill and planarization properties, but suffer from poor etch selectivity to organic photoresist. As a result, a material that offers the combined advantages of inorganic and organic ARC materials is highly desired.

This invention pertains to silsesquioxane resins that exhibit antireflective coating properties for 193 nm light. These antireflective coatings can be stripped at the removal stage and the silsesquioxane resins are stable upon storage. In addition, the presence of a hydride group in the silsesquioxane resin is essential for the desired cure properties and strip-ability as a 193 nm ARC material.

In particular this invention pertains to a method of forming an antireflective coating on an electronic device comprising
(A) applying to an electronic device an ARC composition comprising
 (i) a silsesquioxane resin having the formula

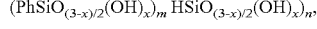

where Ph is a phenyl group, x has a value of 0, 1 or 2; m has a value of 0.05 to 0.95, n has a value of 0.05 to 0.95 and m+n≈1; and
 (ii) a solvent; and
(B) removing the solvent and curing the silsesquioxane resin to form an antireflective coating on the electronic device.

The silsesquioxane resins useful in forming the antireflective coating have the formula $(PhSiO_{(3-x)/2}(OH)_x)_m$ $HSiO_{(3-x)/2}(OH)_x)_n$, where Ph is a phenyl group, x has a value of 0, 1 or 2; m has a value of 0.05 to 0.95, n has a value of 0.05 to 0.95 and m+n≈1. Alternatively m has a value of 0.1 to 0.5, alternatively 0.10 to 0.50.

The silsesquioxane resin may be essentially fully condensed or may be only partially condensed. When the silsesquioxane resin is partially condensed less than 40 mole % of the units in the silsesquioxane resin should contain Si—OH groups. Higher amounts of these units can result in instability in the resin and the formation of gels. Typically 6 to 38 mole % of the units in the silsesquioxane resin contain Si—OH groups.

The silsesquioxane resin has a weight average molecular weight (Mw) in the range of 500 to 400,000 and preferably in the range of 500 to 100,000, alternatively 700 to 10,000.

Silsesquioxane resins useful herein may be exemplified by, but not limited to

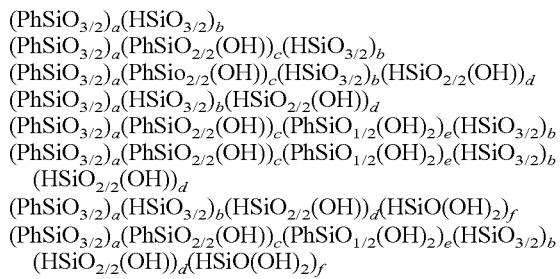

where a>0, b>0, c>0, d>0, e>0, f>0, 0.05≦a+c+e≦0.95 and 0.05≦b+d+f≦0.95 and c+d+e+f≦0.40.

The silsesquioxane resins may be produced by methods known in the art. For example, the silsesquioxane resins may be produced by the hydrolysis and condensation of a mixture of a phenyl trialkoxy and hydrogen trialkoxy silane as set forth in U.S. Pat. No. 5,762,697 to Sakamoto et al. Alternatively they may be produced by the hydrolysis and condensation of a phenyl trichlorosilane and hydrogen trichlorosilane as set forth in U.S. Pat. No. 6,281,285 to Becker et al. and U.S. Pat. No. 5,010,159 to Bank et al.

The silsesquioxane resin is typically produced in the presence of a solvent. Any suitable organic or silicone solvent that does not contain a functional group which may participate in the reaction may be used in producing the silsesquioxane resin. The solvent is generally used in an amount of 40 to 98 weight percent based on the total weight of solvent and silane reactants, alternatively 70 to 90 weight percent. The reaction may be carried out as a dual phase or single-phase system.

Useful organic solvents may be exemplified by, but not limited to, saturated aliphatics such as n-pentane, hexane, n-heptane, and isooctane; cycloaliphatics such as cyclopentane and cyclohexane; aromatics such as benzene, toluene, xylene, mesitylene; ethers such as tetrahydrofuran, dioxane, ethylene glycol dietheyl ether, ethylene glycol dimethyl ether; ketones such as methylisobutyl ketone (MIBK) and cyclohexanone; halogen substituted alkanes such as trichloroethane; halogenated aromatics such as bromobenzene and chlorobenzene; esters such as isobutyl isobutyrate and propyl propronate. Useful silicone solvents may be exemplified by, but not limited to cyclic siloxanes such as octamethylcyclotetrasiloxane, and decamethylcyclopentasiloxane. A single solvent may be used or a mixture of solvents may be used.

The reaction to produce the silsesquioxane resin can be carried out at any temperature so long as it does not cause significant gellation or cause curing of the silsesquioxane resin. Typically the reaction is carried out at a temperature in the range of 5° C. to 150° C., with ambient temperature suggested.

The time to form the silsesquioxane resin is dependent upon a number of factors such as the temperature, the type and amount of silane reactants, and the amount of catalyst, if present. Typically the reaction time is from several minutes to several hours. One skilled in the art will be able to readily determine the time necessary to complete the reaction.

Following completion of the reaction the catalyst may be optionally removed. Methods for removing the catalyst are well know in the art and would include neutralization, stripping or water washing or combinations thereof. The catalyst may negatively impact the shelf life of the silicone resin especially when in solution thus its removal is suggested.

In the process for making the silsesquioxane resin, after the reaction is complete, volatiles may be removed from the silsesquioxane resin solution under reduced pressure. Such volatiles include alcohol by-products, excess water, catalyst, hydrochloric acid (chlorosilane routes) and solvents. Methods for removing volatiles are known in the art and include, for example, distillation.

Following the reaction to produce the silsesquioxane resin a number of optional steps maybe carried out to obtain the silsesquioxane resin in the desired form. For example, the silsesquioxane resin may be recovered in solid form by removing the solvent. The method of solvent removal is not critical and numerous methods are well known in the art (e.g. distillation under heat and/or vacuum). Once the silsesquioxane resin is recovered in a solid form, the resin can be optionally re-dissolved in the same or another solvent for a particular use. Alternatively, if a different solvent, other than the solvent used in the reaction, is desired for the final product, a solvent exchange may be done by adding a secondary solvent and removing the first solvent through distillation, for example. Additionally, the resin concentration in solvent can be adjusted by removing some of the solvent or adding additional amounts of solvent.

The silsesquioxane resin is combine with a solvent and applied to an electronic device to produce a coated substrate. The solvent is removed and the silsesquioxane resin is cured to produce the antireflective coating.

Typically the electronic device is a semiconductor device, such as silicon-based devices and gallium arsenide-based devices intended for use in the manufacture of a semiconductor component. Typically, the device comprises at least one semiconductive layer and a plurality of other layers comprising various conductive, semiconductive, or insulating materials.

Useful solvents (ii) include, but are not limited to, 1-methoxy-2-propanol, propylene glycol monomethyl ethyl acetate and cyclohexanone, among others. The ARC composition typically comprises from about 10% to about 99.9 wt % solvent based on the total weight of the ARC composition, alternatively 80 to 95 wt %.

The ARC composition can further comprise a cure catalyst. Suitable cure catalysts include inorganic acids, photo acid generators and thermal acid generators. Cure catalysts may be exemplified by, but not limited to sulfuric acid ($H_2SO_4$), (4-ethylthiophenyl) methyl phenyl sulfonium triflate and 2-Naphthyl diphenylsulfonium triflate. Typically a cure catalyst is present in an amount of up to 1000 ppm, alternatively 500 ppm, based on the total weight of the ARC composition.

Specific methods for application of the ARC composition to the electronic device include, but are not limited to, spin-coating, dip-coating, spay-coating, flow-coating, screen-printing and others. The preferred method for application is spin coating. Typically, coating involves spinning the electronic device, at about 2000 RPM, and adding the ARC composition to the surface of the spinning electronic device.

The solvent is removed and the silsesquioxane resin is cured to form the anti-reflective coating on the electronic device. Curing generally comprises heating the coated substrate to a sufficient temperature for a sufficient duration to lead to curing. For example, the coated electronic device can be heated at 80° C. to 450° C. for 0.1 to 60 minutes, alternatively 150° C. to 275° C. for of 0.5 to 5 minutes, alternatively 200° C. to 250° C. for 0.5 to 2 minutes. Any method of heating may be used during the curing step. For example, the coated electronic device may be placed in a quartz tube furnace, convection oven or allowed to stand on hot plates.

To protect the silsesquioxane resin of the coated composition from reactions with oxygen or carbon during curing, the curing step can be performed under an inert atmosphere. Inert atmospheres useful herein include, but are not limited to nitrogen and argon. By "inert" it is meant that the environment contain less than 50 ppm and preferably less than 10 ppm of oxygen. The pressure at which the curing and removal steps are carried out is not critical. The curing step is typically carried out at atmospheric pressure although sub or super atmospheric pressures may work also.

Once cured, the electronic device comprising the anti-reflective coating can be used in further substrate processing steps, such as photolithography. When used in photolithography, a resist image is formed over the anti-reflective coating. The process for forming the resist image comprises (a) forming a film of a resist composition on top of the anti-reflective coating; (b) imagewise exposing the resist film to radiation to produce an exposed film; and (c) developing the exposed film to produce an image. The anti-reflective coatings on the electronic device are particularly useful with resist compositions that are imagewise exposed to ultraviolet radiation having a wavelength of 157 nm to 365 nm, alternatively ultraviolet radiation having a wavelength of 157 nm or 193 nm. Once an image has been produced in the resist film, then a pattern is etched in the anti-reflective coating. Known etching materials may be used to remove the anti-reflective coating. Additional steps or removing the resist film and remaining anti-reflective coating may be employed to produce a device having the desired architecture.

The ARC coating compositions can be cured at lower temperatures and they produce coatings that can be removed by stripping solutions. Further, as seen in FIG. 1, the k and n values can be adjusted by adjusting the amount of (PhSi$O_{(3-x)/2}$(OH)$_x$) units in the silsesquioxane resin. Typically, the anti-reflective coatings produced herein have a k (adsorption) @193 of >0 to ~1.0 and a "n" (refractive index) of ~1.5 to 1.8

The following examples are included to demonstrate preferred embodiments of the invention. It should be appreciated by those of skill in the art that the techniques disclosed in the examples which follow represent techniques discovered by the inventor to function well in the practice of the invention, and thus can be considered to constitute preferred modes for its practice. However, those of skill in the art should, in light of the present disclosure, appreciate that many changes can be made in the specific embodiments which are disclosed and still obtain a like or similar result without departing from the spirit and scope of the invention.

DRAWINGS

FIG. 1 shows the relationship between n@193 and mole % Ph in the silsesquioxane resin and the relationship between k@193 and mole % Ph in the silsequioxane resin.

EXAMPLES

Example 1

Resin Synthesis: $T^{Ph}_{0.35}T^{H}_{0.65}$

A solution of 120 grams of PGMEA, 18.5 grams (0.0875 moles) of phenyltrichlorosilane, and 22.01 grams (0.1625 moles) of trichlorosilane were transferred to the reactor under nitrogen. A solution of 200 grams of PGMEA and 10 grams (0.555 moles) of water was added to the solution of trichlorosilanes over a one-hour period. The reaction was allowed to body, stirring at 20° C. for another hour after the addition of the wet PGMEA was complete. The ratio of water to silicon was 2.2:1. The resin solution was concentrated to approximately 10 wt % by rotary evaporator at 40° C. Approximately 40 grams of ethanol was added to the resin solution. The flask was returned to the rotary evaporator and the solution was striped once more to approximately 20 wt %. The solution was diluted to 10 wt % with additional PGMEA. The solution was filtered through a 0.20 micron PTFE filter and stored in a 250 mL HDPE bottle.

Example 2

Resin Synthesis: $T^{Ph}_{0.25}T^{H}_{0.75}$

A solution of 120 grams of PGMEA, 13.2 grams (0.0625 moles) of phenyltrichlorosilane, and 25.4 grams (0.1875 moles) of trichlorosilane were transferred to the reactor under nitrogen. A solution of 200 grams of PGMEA and 10 grams (0.555 moles) of water was added to the solution of trichlorosilanes over a one-hour period. The reaction was allowed to body, stirring at 20° C. for another hour after the addition of the wet PGMEA was complete. The ratio of water to silicon was 2.2:1. The resin solution was concentrated to approximately 10 wt % by rotary evaporator at 40° C. Approximately 40 grams of ethanol was added to the resin solution. The solution was striped once more to approximately 20 wt %. The solution was diluted to 10 wt % with additional PGMEA. The solution was filtered through a 0.20 micron PTFE filter and stored in a 250 mL HDPE bottle.

Example 3

Resin Synthesis: $T^{Ph}_{0.15}T^{H}_{0.85}$

A solution of 120 grams of PGMEA, 7.93 grams (0.0375 moles) of phenyltrichlorosilane, and 28.8 grams (0.2125 moles) of trichlorosilane were transferred to the reactor under nitrogen. A solution of 200 grams of PGMEA and 10 grams (0.555 moles) of water was added to the solution of trichlorosilanes over a one-hour period. The reaction was allowed to body, stirring at 20° C. for another hour after the addition of the wet PGMEA was complete. The ratio of water to silicon was 2.2:1. The resin solution was concentrated to approximately 10 wt % by rotary evaporator at 40° C. Approximately 40 grams of ethanol was added to the resin solution. The solution was striped once more to approximately 20 wt %. The solution was diluted to 10 wt % with additional PGMEA. The solution was filtered through a 0.20 micron PTFE filter and stored in a 250 mL HDPE bottle.

Comparative Example 1

Resin Synthesis: $T^{Ph}_{0.35}T^{Me}_{0.65}$

A solution of 120 grams of PGMEA, 18.5 grams (0.0875 moles) of phenyltrichlorosilane, and 24.29 grams (0.1625 moles) of methyltrichlorosilane were transferred to the reactor under nitrogen. A solution of 200 grams of PGMEA and 10 grams (0.555 moles) of water was added to the solution of trichlorosilanes over a one-hour period. The reaction was allowed to body, stirring at 20° C. for another hour after the addition of the wet PGMEA was complete. The ratio of water to silicon was 2.2:1. The resin solution was concentrated to approximately 10 wt % by rotary evaporator at 40° C. Approximately 40 grams of ethanol was added to the resin solution. The solution was striped once more to approximately 20 wt %. The solution was diluted to 10 wt % with additional PGMEA. The solution was filtered through a 0.20 micron PTFE filter and stored in a 250 mL HDPE bottle.

Comparative Example 2

Resin Synthesis: $T^{Ph}_{0.25}T^{Me}_{0.75}$

A solution of 120 grams of PGMEA, 13.2 grams (0.0625 moles) of phenyltrichlorosilane, and 28.0 grams (0.1875 moles) of methyltrichlorosilane were transferred to the reactor under nitrogen. A solution of 200 grams of PGMEA and 10 grams (0.555 moles) of water was added to the solution of trichlorosilanes over a one-hour period. The reaction was allowed to body, stirring at 20° C. for another hour after the addition of the wet PGMEA was complete. The ratio of water to silicon was 2.2:1. The resin solution concentrated to approximately 10 wt % by rotary evaporator at 40° C. Approximately 40 grams of ethanol was added to the resin solution. The rotary evaporator and the solution was striped once more to approximately 20 wt %. The solution was diluted to 10 wt % with additional PGMEA. The solution was filtered through a 0.20 micron PTFE filter and stored in a 250 mL HDPE bottle.

Comparative Example 3

Resin Synthesis: $T^{Ph}_{0.15}T^{Me}_{0.85}$

A solution of 120 grams of PGMEA, 7.93 grams (0.0375 moles) of phenyltrichlorosilane, and 31.77 grains (0.2125 moles) of methyltrichlorosilane were transferred to the reactor under nitrogen. A solution of 200 grams of PGMEA and 10 grams (0.555 moles) of water was added to the solution of trichlorosilanes over a one-hour period. The reaction was allowed to body, stirring at 20° C. for another hour after the addition of the wet PGMEA was complete. The ratio of water to silicon was 2.2:1. The resin solution was concentrated to approximately 10 wt % by rotary evaporator at 40° C. Approximately 40 grams of ethanol was added to the resin solution. The rotary evaporator and the solution was striped once more to approximately 20 wt %. The solution was diluted to 10 wt % with additional PGMEA. The solution was filtered through a 0.20 micron PTFE filter and stored in a 250 mL HDPE bottle.

Example 4

$T^{Ph}_{0.5}T^{H}_{0.5}$

To a flask were added 120 g of propylene glycol methyl ether acetate (PGMEA, 120 g), phenyltrichlorosilane (42.31 g, 0.20 mole), trichlorosilane (27.09 g, 0.20 mole). The solution was cooled to 20° C. under a nitrogen atmosphere while stirring. To a separate flask, PGMEA (350 g) and water (12.96 g, 0.72 mole) were added and mixed; the well mixed homogenous water/PGMEA solution was then added to the reactor over 90 minutes. After the addition the reaction flask was allowed to body for two hours. The solution was concentrated using a rotary evaporator to approximately 21% by weight resin at 40° C. by removing most of HCl as vapor and a small a mount of PGMEA. Next, ethanol (50 g) was added to the solution and the flask contents rotary evaporated to remove the ethanol, residual water, hydrochloric acid, and PGMEA. The solution was then diluted to 10% wt by the addition of PGMEA (Yield: 357 g).

Example 5

Resin: $T^{Ph}_{0.7}T^{H}_{0.3}$

To a flask were added propylene glycol methyl ether acetate (PGMEA, 140 g), phenyltrichlorosilane (71.0 g, 0.34 mole), trichlorosilane (19.7 g, 0.15 mole). The solution was cooled to 20° C. under a nitrogen atmosphere while stirring. In a separate flask were added PGMEA (350 g) and water (15.90 g, 0.89 mole); The water/PGMEA solution was added to the reactor over 90 minutes. After the addition the reaction flask was allowed to warm to 20° C. and stirred for two hours to body the formed resin. The solution in the flask was concentrated using a rotary evaporator to approximately 21% by weight resin at 40° C. by removing most of HCl as vapor and a small a mount of PGMEA. Next, ethanol (80 g) was added to the solution and the flask contents rotary evaporated to remove the ethanol, residual water, hydrochloric acid, and PGMEA. The solution was then diluted to 10-weight percent resin by the addition of PGMEA (Yield: 450 g).

Film Coating and Characterization

The film coating on wafers was processed on a Karl Suss CT62 spin coater. The resin PGMEA solution was first filtered through a 0.20 micron PTFE filter and then spin coated onto standard single side four inch polished low resistivity wafers or double sided polished FTIR wafers (spin speed=2000 rpm; acceleration speed=5000, time=20 seconds). Films were cured at a temperature (200-250° C.) for 90 seconds as indicated in Tables 3 or 4 using a rapid thermal processing (RTP) oven with a nitrogen gas purge. The film thickness, refractive index and k value were determined using a J. A. Woollam ellipsometer. The thickness values recorded were the average of nine measurements. PGMEA resistance after cure was determined by measuring the film thickness change before and after PGMEA rinse. The wet removal rate was assessed with two commercial wet stripping solution NE89 and CC1. Contact angle measurements using water and methylene iodide as liquids were used to calculate the critical surface tension of wetting using the Zisman approach. Results are given in Tables 1-4.

TABLE 1

$T^{H}T^{Ph}$ Resins

| Example | $M_w$ (x 10$^{-3}$) | $M_w/M_n$ | Film Thickness (Å) | n (193 nm) | k (193) | Contact Angle (°) $H_2O$ | MD | Surface Energy (dynes/cm$^2$) |
|---|---|---|---|---|---|---|---|---|
| 1 | 128.1 | 31.1 | 2255 | 1.857 | 0.6154 | 89 | 39 | 40 |
| 2 | 270.5 | 45.9 | 2125 | 1.766 | 0.5767 | 87 | 47 | 36 |
| 3 | 411.7 | 80.5 | 2398 | 1.782 | 0.3474 | 87 | 56 | 32 |
| 4 | 21.80 | 3.16 | 2024 | 1.824 | 0.8142 | 89 | 45 | 37 |
| 5 | 4.21 | 1.71 | 2109 | 1.8323 | 0.9319 | N/A | N/A | N/A |

TABLE 2

$T^{Me}T^{Ph}$ Resins (Comparative)

| Example | Mw (x 10$^{-3}$) | Mw/Mn | Film Thickness (Å) | n (193 nm) | k (193) | Contact Angle (°) $H_2O$ | MD | Surface Energy (dynes/cm$^2$) |
|---|---|---|---|---|---|---|---|---|
| 1C | 3.1 | 1.65 | 2176 | 1.831 | 0.5984 | 84 | 53 | 33 |
| 2C | 5.0 | 1.76 | 2297 | 1.8124 | 0.4662 | 92 | 54 | 32 |
| 3C | 7.8 | 2.31 | 2244 | 1.7481 | 0.3065 | 92 | 58 | 30 |

TABLE 3

$T^H T^{Ph}$ Resins

| Example | Bake Temp °C. | Coating Thickness (Å) | Thickness after PGMEA (Å) | Loss after PGMEA (%) | Loss after NE89 | Loss after CCI |
|---|---|---|---|---|---|---|
| 1 | 200 | 2183 | 2103 | 3.66 | 100% | 100% |
|   | 225 | 2227 | 2170 | 2.51 | 100% | 100% |
|   | 250 | 2132 | 2113 | 0.89 | 100% | 100% |
| 2 | 200 | 2337 | 2334 | 0.13 | 100% | 100% |
|   | 225 | 2351 | 2350 | 0.00 | 100% | 100% |
|   | 250 | 2354 | 2348 | 0.00 | 100% | 100% |
| 3 | 200 | 2338 | 2336 | 0.00 | 100% | 100% |
|   | 225 | 2358 | 2354 | 0.00 | 100% | 100% |
|   | 250 | 2375 | 2370 | 0.00 | 100% | 100% |

TABLE 4

$T^{Me} T^{Ph}$ Resins (Comparative)

| Example | Bake Temp (°C.) | Coating Thickness (Å) | Thickness after PGMEA (Å) | Loss after PGMEA (%) | Loss after NE89 | Loss after CCI |
|---|---|---|---|---|---|---|
| 1C | 200 | 1548 | 30 | 100 | N/A | N/A |
|    | 225 | 1481 | 35 | 100 | N/A | N/A |
|    | 250 | 1402 | 40 | 100 | N/A | N/A |
|    | 300 | 1477 | 584 | 61.5 | 686 | 707 |
|    | 350 | 1384 | 1377 | 0.51 | 1387 | 1397 |
| 2C | 200 | 1473 | 34 | 100 | N/A | N/A |
|    | 225 | 1445 | 35 | 100 | N/A | N/A |
|    | 250 | 1346 | 39 | 100 | N/A | N/A |
|    | 300 | 1487 | 647 | 56.5 | 670 | 658 |
|    | 350 | 1378 | 1375 | 0.22 | 1373 | 1379 |
| 3C | 200 | 1569 | 55 | 100 | N/A | N/A |
|    | 225 | 1545 | 37 | 100 | N/A | N/A |
|    | 250 | 1509 | 52 | 100 | N/A | N/A |
|    | 300 | 1748 | 1711 | 2.00 | 1706 | 1733 |
|    | 350 | 1676 | 1678 | −0.12 | 1666 | 1682 |

What is claimed is:

1. A method of forming an antireflective coating on an electronic device comprising
   (A) applying to an electronic device an ARC composition comprising
      (i) a silsesquioxane resin having the formula $(PhSiO_{(3-x)/2}(OH)_x)_m (HSiO_{(3-x)/2}(OH)_x)_n$, where Ph is a phenyl group, x has a value of 0, 1 or 2; m has a value of 0.05 to 0.95, n has a value of 0.05 to 0.95 and m+n≈1; and
      (ii) a solvent; and
   (B) removing the solvent and curing the silsesquioxane resin to form an antireflective coating on the electronic device.

2. The method as claimed in claim 1 wherein m has a value of 0.10 to 0.50 and n has a value of 0.10 to 0.50.

3. The method as claimed in claim 1 wherein in the silsesquioxane resin less than 40 mole % of the units contain Si—OH groups.

4. The method as claimed in claim 1 wherein in the silsesquioxane resin 6 to 38 mol % of the units contain Si—OH groups.

5. The method as claimed in claim 1 wherein the solvent (ii) is selected from 1-methoxy-2-propanol, propylene methyl ether acetate and cyclohexanone.

6. The method as claimed in claim 1 wherein the ARC composition contains 80 to 95 wt % of solvent, based on the weight of the ARC composition.

7. The method as claimed in claim 1 wherein the ARC composition additionally contains a cure catalyst.

8. The method as claimed in claim 1 wherein the ARC composition is applied by spin-coating.

9. The method as claimed in claim 1 wherein the silsesquioxane resin is cured by heating.

10. The method as claimed in claim 9 wherein the silsesquioxane resin is cured by heating at a temperature in the range of 150° C. to 275° C.

11. The method as claimed in claim 1 wherein the silsesquioxane resin is cured by heating at a temperature in the range of 200° C. to 250° C.

12. The method as claimed in claim 1 wherein the silsesquioxane resin is cured by heating in an inert atmosphere.

13. A method of forming an antireflective coating on an electronic device comprising
   (A) applying to an electronic device an ARC composition comprising
      (i) a silsesquioxane resin having the formula $(PhSiO_{(3-x)/2}(OH)_x)_m (HSiO_{(3-x)/2}(OH)_x)_n$, where Ph is a phenyl group, x has a value of 0, 1 or 2; m has a value of 0.05 to 0.95, n has a value of 0.05 to 0.95 and m+n≈1; and
      (ii) a solvent;
   (B) removing the solvent and curing the silsesquioxane resin to form an antireflective coating on the electronic device; and
   (C) forming a resist image over the antireflective coating.

14. The method as claimed in claim 13 wherein the resist image is formed by
   (a) forming a film of a resist composition on top of the anti-reflective coating;
   (b) imagewise exposing the resist film to radiation to produce an exposed film;
   (c) developing the exposed film to produce the image.

15. A method of forming an antireflective coating on an electronic device comprising
   (A) applying to an electronic device an ARC composition comprising
      (i) a silsesquioxane resin having the formula $(PhSiO_{(3-x)/2}(OH)_x)_m (HSiO_{(3-x)/2}(OH)_x)_n$, where Ph is a phenyl group, x has a value of 0, 1 or 2; m has a value of 0.05 to 0.95, n has a value of 0.05 to 0.95 and m+n≈1; and
      (ii) a solvent;
   (B) removing the solvent and curing the silsesquioxane resin to form an antireflective coating on the electronic device
   (C) forming a resist image over the antireflective coating and
   (D) etching a pattern in the anti-reflective film.

16. A method of forming an antireflective coating on an electronic device comprising
   (A) applying to an electronic device an ARC composition comprising
      (i) a silsesquioxane resin having the formula $(PhSiO_{(3-x)/2}(OH)_x)_m (HSiO_{(3-x)/2}(OH)_x)_n$, where Ph is a phenyl group, x has a value of 0, 1 or 2; m has a value of 0.05 to 0.95, n has a value of 0.05 to 0.95 and $m+n \approx 1$; and (ii) a solvent;

(B) removing the solvent and curing the silsesquioxane resin to form an antireflective coating on the electronic device;

(C) forming a resist image over the antireflective coating;

(D) etching a pattern in the anti-reflective film;

(E) removing the resist image and the anti-reflective film.

* * * * *